United States Patent
Ando et al.

(10) Patent No.: US 8,734,913 B2
(45) Date of Patent: May 27, 2014

(54) FORMATION METHOD OF COATING

(75) Inventors: Junji Ando, Anjo (JP); Tomoo Suzuki, Aichi (JP); Tomoki Ogawa, Kariya (JP); Masahiro Suzuki, Kashiba (JP); Kazuyoshi Yamakawa, Nishinomiya (JP); Toshiya Kubo, Nagoya (JP); Hiroyuki Hashitomi, Anjo (JP); Daigo Yamamoto, Aichi (JP)

(73) Assignees: JTEKT Corporation, Osaka-shi (JP); CNK Co., Ltd., Kariya (JP)

( * ) Notice: Subject to any disclaimer, the term of this patent is extended or adjusted under 35 U.S.C. 154(b) by 165 days.

(21) Appl. No.: 13/204,208

(22) Filed: Aug. 5, 2011

(65) Prior Publication Data

US 2012/0034393 A1     Feb. 9, 2012

(30) Foreign Application Priority Data

Aug. 6, 2010    (JP) ................................ 2010-177138

(51) Int. Cl.
*C23C 16/32*      (2006.01)
*H05H 1/24*       (2006.01)

(52) U.S. Cl.
USPC ............................................. 427/569; 427/8

(58) Field of Classification Search
USPC ...................................................... 427/569, 8
See application file for complete search history.

(56) References Cited

U.S. PATENT DOCUMENTS

| | | | |
|---|---|---|---|
| 5,185,067 A * | 2/1993 | Shibahara et al. | ............ 427/523 |
| 2004/0038033 A1 | 2/2004 | Massler et al. | |
| 2005/0031797 A1* | 2/2005 | Matsuyama | ................... 427/569 |
| 2007/0149299 A1 | 6/2007 | Azuma et al. | |

FOREIGN PATENT DOCUMENTS

| | | |
|---|---|---|
| JP | 2002-049047 A | 2/2002 |
| JP | 2004-501793 A | 1/2004 |
| JP | 2006-9110 | 1/2006 |
| JP | 2006-22882 | 1/2006 |
| JP | 2007-177955 A | 7/2007 |
| JP | 2011-2096 | 1/2011 |
| WO | WO 2009/102070 A1 | 8/2009 |

OTHER PUBLICATIONS

Yuichi Aoki, et al., "Tribological properties of segment-structured diamond-like carbon films", Tribology International, Butterworth Scientific Ldt, vol. 37, No. 11-12, XP004614314, Nov. 1, 2004, pp. 941-947.

Extended European Search Report issued on Nov. 7, 2011 in the corresponding European Application No. 11176522.8.

Office Action issued in JP 2010-177138 on Mar. 4, 2014 (w/ partial English translation).

\* cited by examiner

*Primary Examiner* — Kelly M Gambetta
(74) *Attorney, Agent, or Firm* — Oblon, Spivak, McClelland, Maier & Neustadt, L.L.P.

(57) ABSTRACT

A formation method of a coating that coats a coated body with the coating includes: generating cylindrical plasma in a vacuum deposition chamber as well as supplying material gas into the vacuum deposition chamber; applying pulse voltage to the coated body; and attaching a shield member that shields an uncoated member to an uncoated part where the coating of the coated body is not formed with separation spacing over a coated part where the coating is to be formed for preventing decrease of hardness of the coating in the coated part.

11 Claims, 10 Drawing Sheets

FIG. 6A
PHASE: 90°
FIG. 6B
PHASE: 0°
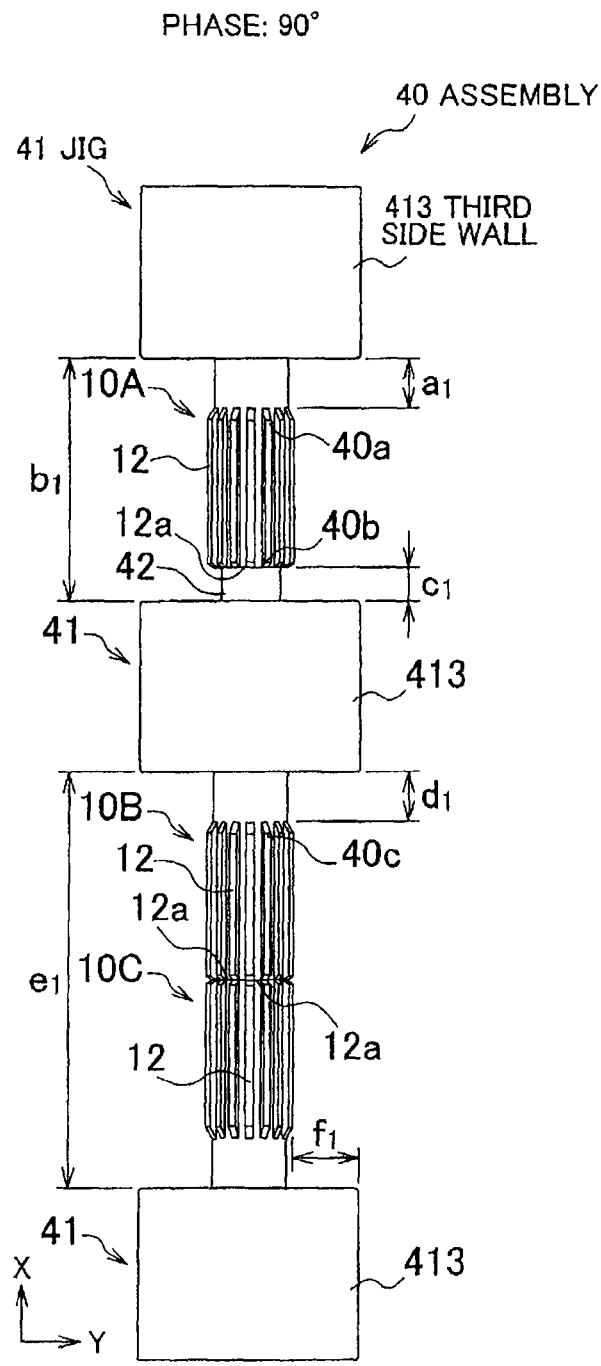
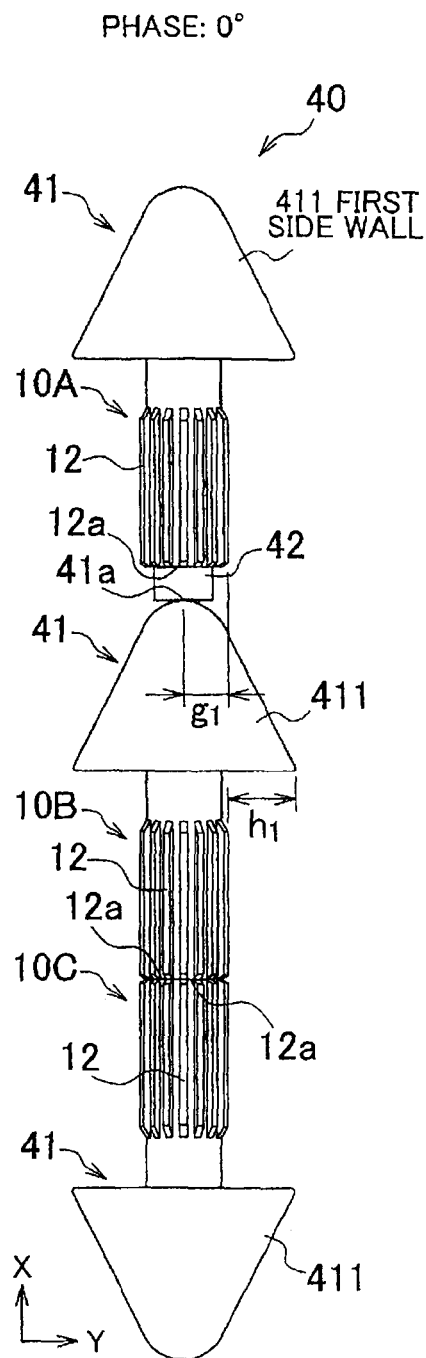

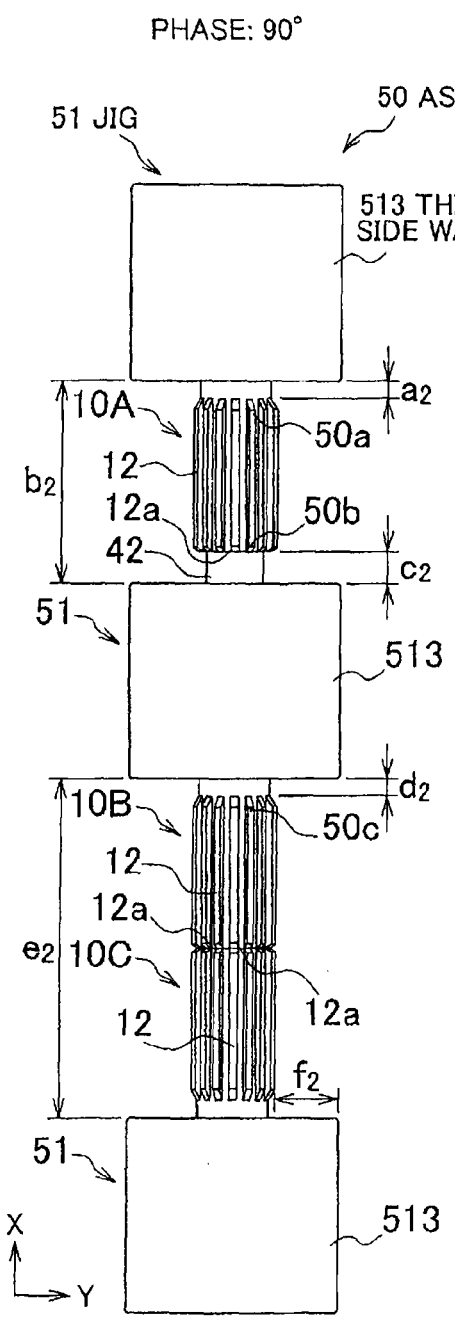
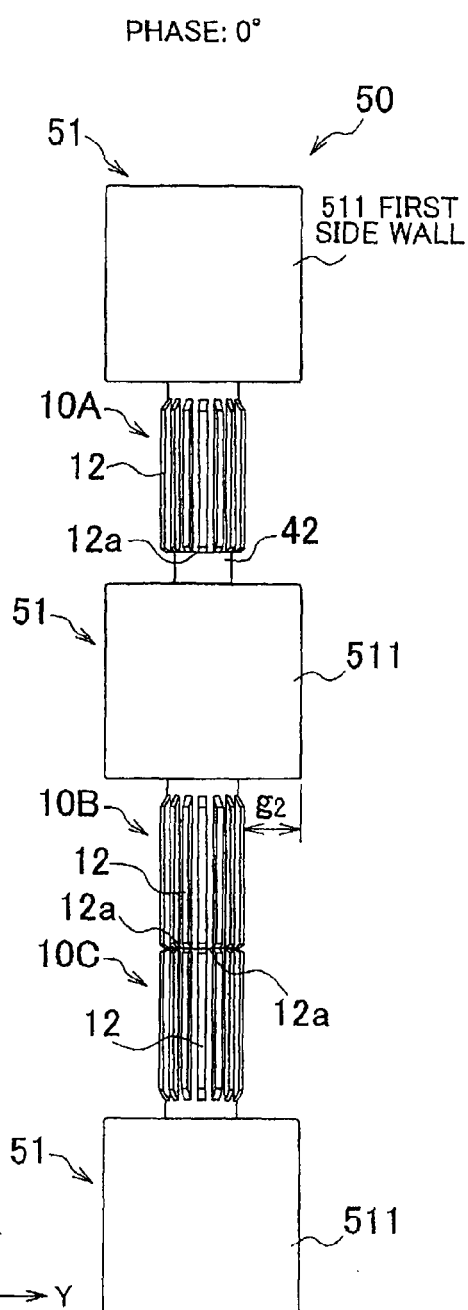

F I G . 9 A

| | $\alpha_1$ (mm) | $\alpha_2$ (mm) | $\beta_{90}$ (mm) | $\beta_0$ (mm) | $\dfrac{\alpha_1 \times \alpha_2}{\beta_{90} \times \beta_0}$ | $\gamma$ (mm) | $\dfrac{\alpha_1 \times \alpha_2}{\gamma^2}$ | KNOOP HARDNESS (kgf/mm$^2$) |
|---|---|---|---|---|---|---|---|---|
| FIRST SITE 40a | 35($a_1$) | 143($b_1$) | 23($f_1$) | 23($h_1$) | 9.5 | 29.1 | 5.91 | 1247 |
| SECOND SITE 40b | 9($c_1$) | 143($b_1$) | 23($f_1$) | 0($g_1$) | — | — | — | 1259 |
| THIRD SITE 40c | 35($d_1$) | 272($e_1$) | 23($f_1$) | 23($h_1$) | 18.0 | 29.1 | 11.24 | 1416 |
| FOURTH SITE 50a | 17($a_2$) | 128($b_2$) | 23($f_2$) | 16($g_2$) | 5.9 | 25.0 | 3.48 | 1110 |
| FIFTH SITE 50b | 9($c_2$) | 128($b_2$) | 23($f_2$) | 16($g_2$) | 3.1 | 25.0 | 1.84 | 990 |
| SIXTH SITE 50c | 17($d_2$) | 237($e_2$) | 23($f_2$) | 16($g_2$) | 10.9 | 25.0 | 6.45 | 1300 |

FORMATION METHOD OF COATING

INCORPORATION BY REFERENCE

The disclosure of Japanese Patent Application No. 2010-177138 filed on Aug. 6, 2010 including the specification, drawings and abstract is incorporated herein by reference in its entirety.

BACKGROUND OF THE INVENTION

1. Field of the Invention

The present invention relates to a formation method of coatings.

2. Description of Related Art

For purpose of improving wear resistance and lubricity of slide parts, Diamond Like Carbon (hereinafter, abbreviated as "DLC") films are formed on slide members that slide onto other members. If there is a part of the slide member on which the DLC film is not formed, the DLC film is formed on the entire slide member first, and the DLC film on the part is then removed (for example, see Japanese Patent Application Publication No. 2006-9110 (JP-A-2006-9110)).

In a DLC coating removal method disclosed in JP-A-2006-9110, a workpiece is covered with a masking member such that an opening is positioned at the part where the DLC film is to be removed, and then etching gas is blown onto the opening at 26 MPa or higher to etch and remove the DLC film.

According to the DLC coating removal method disclosed in JP-A-2006-9110, although a member of which the DLC film is formed only on the desired parts can be obtained, the DLC film has to be temporarily formed and then removed. Thus, the number of processes increases, and it becomes a factor in increasing the cost of production.

Furthermore, it is determined that when the DLC film formation with the application of the masking member to the workpiece to shield a part of the workpiece is compared with the DLC film formation without the application of the masking member, the hardness of the DLC film decreases in the case of the DLC film formation with the application of the masking member to shield a part of the workpiece.

SUMMARY OF THE INVENTION

The present invention provides the formation method of the coating that allows the formation of the coating on the part of a coated body except for an uncoated part and that allows the prevention of decrease of the hardness of the coating in a coated part.

The inventors have found, as a result of intense studies to solve the above problems, that the hardness of the coating on the coated part has a correlation with spacing between a shield member that shields the uncoated part and the coated part and therefore made the invention. The present invention provides the formation method of the coating described below in order to solve the problems.

An aspect of the invention relates to a formation method of a coating that coats a coated body with the coating. The formation method includes: generating cylindrical plasma in a vacuum deposition chamber as well as supplying material gas into the vacuum deposition chamber; applying pulse voltage to the coated body; and attaching a shield member that shields an uncoated member to an uncoated part where the coating of the coated body is not formed with separation spacing over a coated part where the coating is to be formed for preventing decrease of hardness of the coating in the coated part.

According to the above-mentioned aspects, the coating can be formed on the part of the coated body except for the uncoated part, and the decrease of the hardness of the coating in a coated part can be prevented.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 6A is a view from a 90° phase that illustrates a constructive example of an assembly according to the Example 1 of the present invention;

FIG. 6B is a view from a 0° phase that illustrates a constructive example of an assembly according to the Example 1 of the present invention;

FIG. 8A is a view from a 90° phase that illustrates a constructive example of an assembly according to the Example 1 of the present invention;

FIG. 8B is a view from a 0° phase that illustrates a constructive example of an assembly according to the Example 1 of the present invention;

FIG. 9A is a table showing dimensional relationships between the jig and measurement sites of the hardness of the DLC film in the spline fitting parts and the measurement results of the surface hardness about the assembly according to the Examples 1 and 2;

DETAILED DESCRIPTION OF EMBODIMENTS

Hereinafter, embodiments of the present invention will be described as examples of the application to one member of the propeller shaft that transmits driving force of a drive source of the vehicle to a wheel side.

Figure 1:
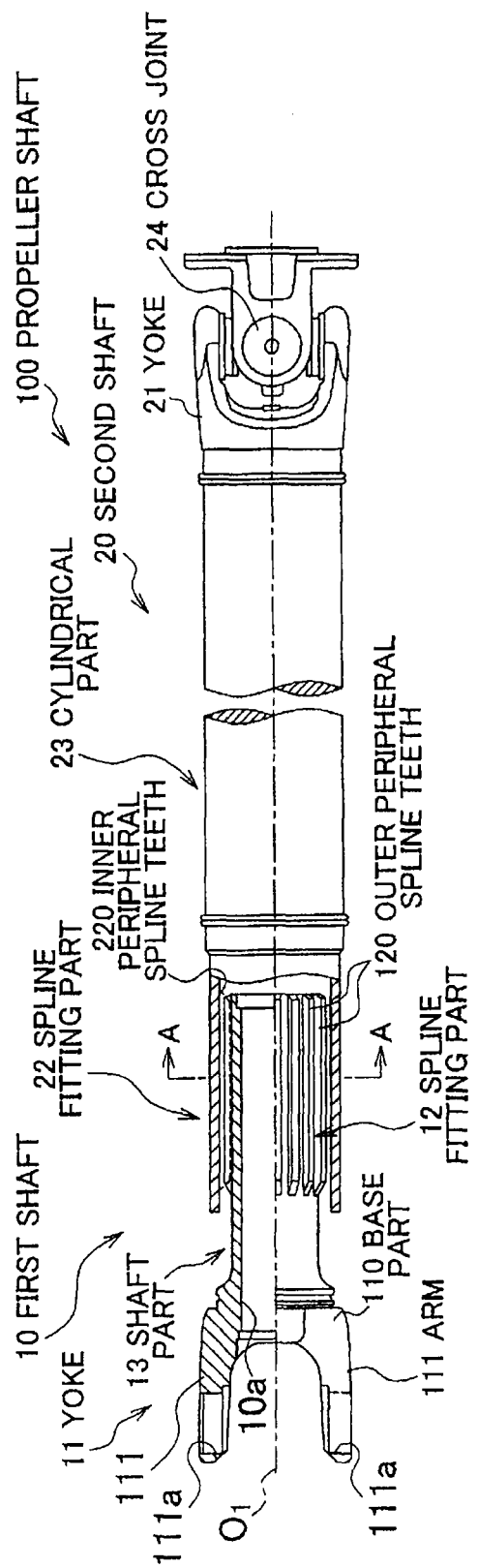
FIG. 1 is a partially cross-sectional view illustrating a constructive example of a vehicle propeller shaft according to an embodiment of the present invention.

FIG. 1 is a partially cross-sectional view illustrating a constructive example of a propeller shaft 100 for a vehicle. As shown in FIG. 1, the propeller shaft 100 includes a first shaft 10 and a second shaft 20 as the component members. The first shaft 10 and the second shaft 20 are slidably coupled. By the above structure, the propeller shaft 100 can extend and contract in the axial direction.

In a part of a surface of the first shaft 10 that slides with the second shaft in the axial direction along with the extension and the contraction of the propeller shaft 100, a coating (described below) for improving wear resistance and lubricity is formed. That is, the first shaft 10 is an example of the coated body.

(Structure of First Shaft) The first shaft 10 is a hollow shaft-like member that is made of carbon steels for machine structural use such as S35C without quenching and tempering or heat treatment, for example. The central portion of the first shaft 10 is formed with a through hole 10a that passes through the first shaft along a central axis O1 in the axial direction.

One end of the first shaft 10 has a yoke 11 that is integrally provided as a coupling part for coupling with the other drive shaft of the vehicle such as an input shaft of a differential gear (not shown). The other end of the first shaft 10 has a cylindrical spline fitting part 12 that is provided with outer peripheral spline teeth 120 extending in the axial direction on the outer periphery at even intervals.

The yoke 11 has a pair of arms 111 that oppose to each other about the central axis O1. The cross section of the yoke 11 is formed in a U-shape in the direction including the pair of arms 111 along the central axis O1. The yoke 11 includes the pair of arms 111 and a base part 110 that is formed in a vicinity of the central axis O1 compared to the pair of arms 111. The pair of arms 111 are formed with retaining holes 111a that retain bearings for rotatably supporting a shaft part of a cross joint (not shown) as a coupling member.

A cylindrical shaft part 13 that extends in the axial direction is provided between the yoke 11 and the spline fitting part 12. The shaft part 13 is formed such that the diameter is smaller than the outside diameter of the spline fitting part 12.

(Structure of Second Shaft) The second shaft 20 is a hollow shaft-like member that is made of carbon steels for machine structural use such as S20C (according to Japanese Industrial Standards), for example. A yoke 21 is integrally provided at one end of the second shaft 20 to couple with an output shaft of a transmission of the vehicle (not shown). The yoke 21 retains a pair of shafts of a cross joint 24 that couples the second shaft 20 with the output shaft of the transmission for rotation.

A cylindrical spline fitting part 22 is provided at the other end of the second shaft 20. Inner peripheral spline teeth 220 that extend in the axial direction are formed in the inner periphery of the cylindrical spline fitting part 22. A cylindrical part 23 that couples with the yoke 21 and the spline fitting part 22 by friction pressure welding for example is interposed between the yoke 21 and the spline fitting part 22.

Figure 2A:
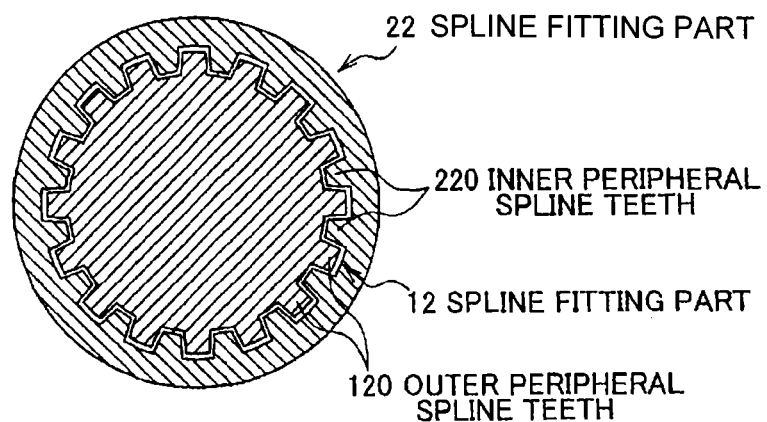
FIG. 2A is a cross-sectional view of a fitting structure of a first shaft and a second shaft according to the embodiment of the present invention, taken along the line A-A in FIG. 1.
Figure 2B:
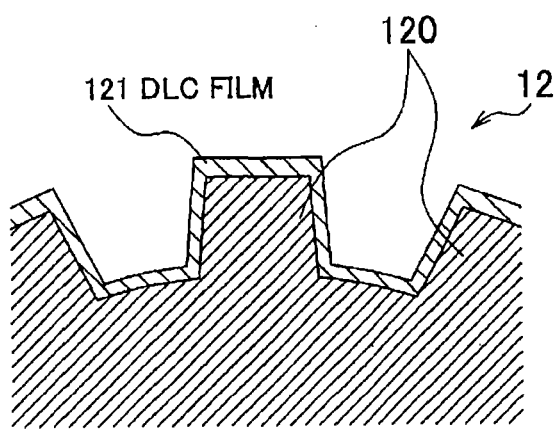
FIG. 2B is a partially enlarged view of the first shaft of FIG. 2A.

(Fitting Structure of First Shaft and Second Shaft) FIG. 2A is a cross-sectional view of a fitting structure of the first shaft 10 and the second shaft 20, taken along the line A-A in FIG. 1. FIG. 2B is a partially enlarged view of the first shaft 10 of FIG. 2A.

As shown in FIG. 2A, the spline fitting part 12 is arranged inside the spline fitting part 22 such that the axes correspond to each other. The outer peripheral spline teeth 120 of the spline fitting part 12 and the inner peripheral spline teeth 220 of the spline fitting part 22 are meshed and fit with each other. By such structure, the first shaft 10 and the second shaft 20 are coupled so as to be relatively unrotatable and to be slidable in the axial direction.

(Composition of DLC Film) As shown in FIG. 2B, the DLC film 121 as an example of a coating is formed on an outer peripheral side surface of the spline fitting part 12 of the first shaft 10. The DLC film 121 is a diamond-like carbon thin film that has a noncrystalline structure with carbon as a major constituent. More specifically, the DLC film 121 has two-layer structure that includes an intermediate layer that contains materials such as chromium for improving adhesion strength to the first shaft 10 and a Si-containing DLC layer (DLC-Si layer) that is formed on the intermediate layer and has gradient composition such that Si content decreases with increasing proximity to the surface.

The DLC film 121 has the thickness of 0.4 to 10 μm, for example, and the adhesion strength of 10 N or greater to the spline fitting part 12 of the first shaft 10. In FIG. 2B, the thickness of the DLC film 121 is exaggerated for illustrative purposes.

Methods of forming such the DLC film such as a chemical vapor deposition (CVD) method, a physical vapor deposition (PVD) method, and ion vapor deposition method are known. In this embodiment, forming the DLC film 121 by using a hot cathode Penning ionization gauge (PIG) plasma CVD method will be described.

Figure 3:
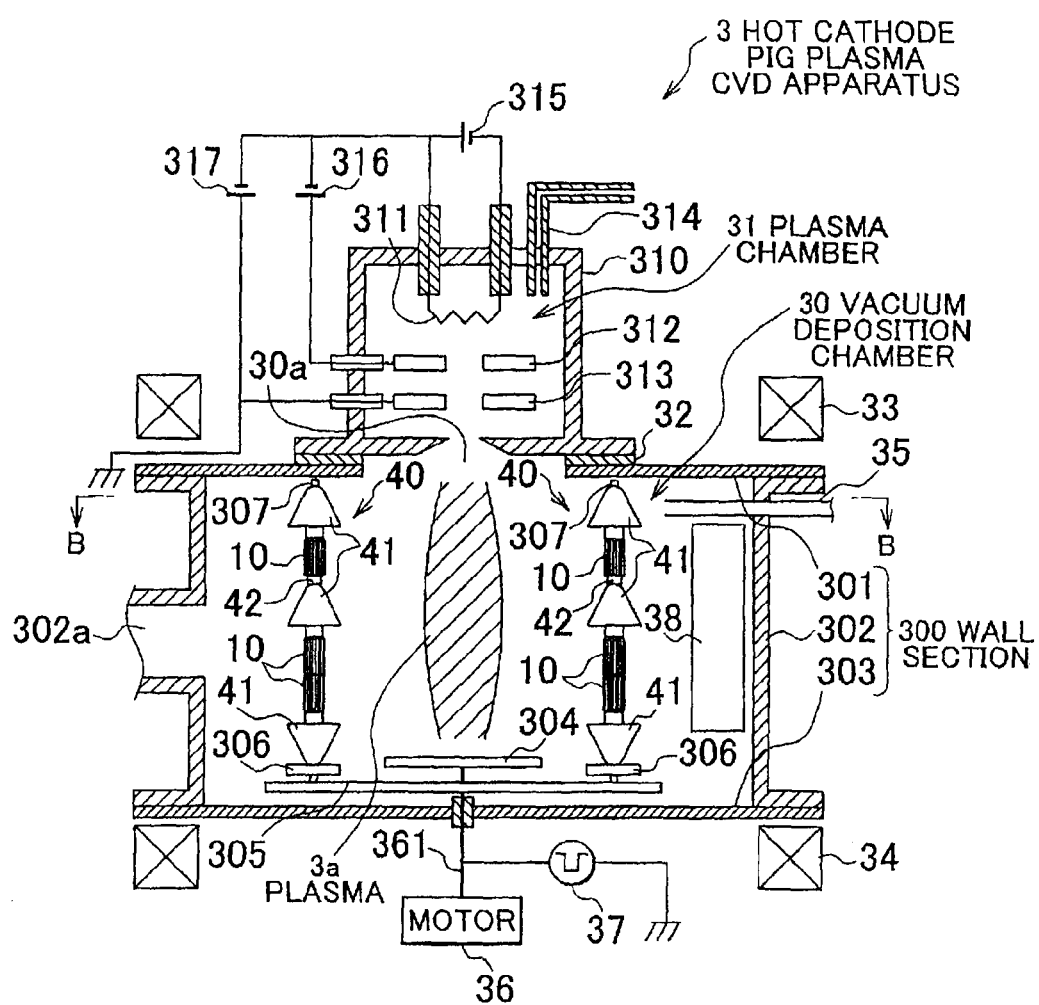
FIG. 3 is a schematic view illustrating a constructive example of a hot cathode PIG plasma CVD apparatus according to an embodiment of the present invention.
Figure 4:
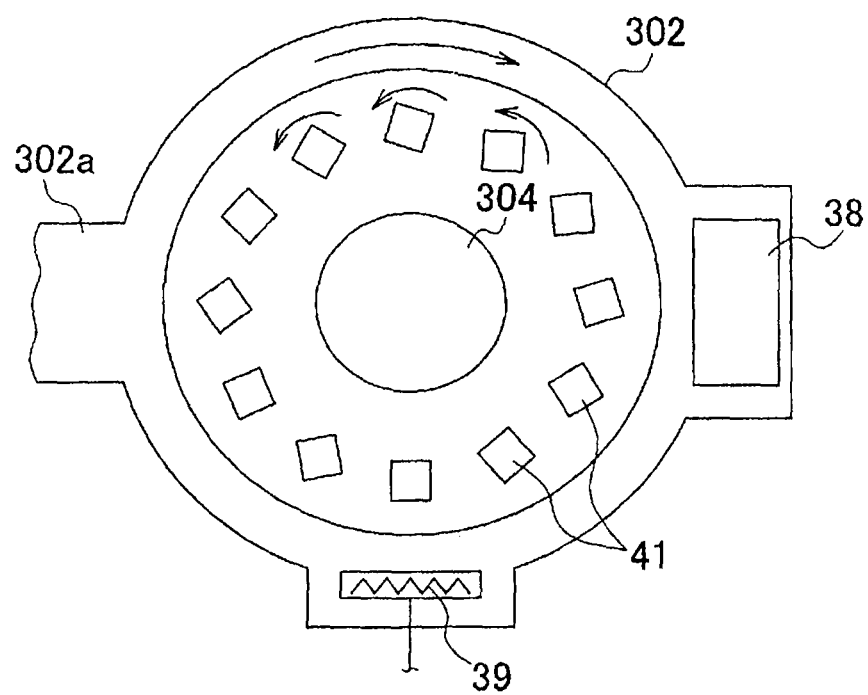
FIG. 4 is a cross-sectional view of the hot cathode PIG plasma CVD apparatus according to an embodiment of the present invention, taken along the line B-B in FIG. 3.

(Structure of Hot Cathode PIG Plasma CVD Apparatus) FIG. 3 is a schematic view illustrating a constructive example of the hot cathode PIG plasma CVD apparatus 3. FIG. 4 is a cross-sectional view of the hot cathode PIG plasma CVD apparatus 3 taken along the line B-B in FIG. 3.

As shown in FIG. 3, this hot cathode PIG plasma CVD apparatus 3 has a vacuum deposition chamber 30 that has an opening 30a in an upper surface and a plasma chamber 31 that is disposed to cover the opening 30a.

The vacuum deposition chamber 30 is separated from the outside by a wall section 300 that includes an upper wall 301, a side wall 302, and a bottom wall 303. The upper wall 301 has the opening 30a that is formed to communicate with the plasma chamber 31. An exhaust outlet 302a is formed in the side wall 302 and connected to a vacuum pump (not shown).

The plasma chamber 31 has a hot cathode 311, an anode 312, an electron injection electrode 313, and a gas nozzle 314 that are disposed inside. The vacuum deposition chamber 30 and the plasma chamber 31 are insulated from each other by an insulator 32 that is made of fluoroplastics, alumina, or the like.

The hot cathode 311 is, for example, a tungsten filament and is heated to the temperature at which thermoelectrons are emitted (2000° C., for example) by electric power that is supplied from a direct-current power supply 315. The anode 312 is energized with positive voltage with respect to the hot cathode 311 by an anode power supply 316. The electron injection electrode 313 is connected to the hot cathode 311 through an electron injection power supply 317 and grounded. The hot cathode 311, the anode 312, and the electron injection electrode 313 are suspended from a wall section 310 of the plasma chamber 31. The plasma chamber 31 is maintained at an insulating potential.

A first coil 33 is disposed above the vacuum deposition chamber 30 and faces the upper wall 301 so as to surround the plasma chamber 31. A second coil 34 that has the same diameter with the first coil 33 is disposed below the vacuum deposition chamber 30 and faces the bottom wall 303. A nozzle 35 that introduces a material gas into the vacuum deposition chamber 30 is provided to pass through the side wall 302.

A reflecting electrode 304 is disposed in the vacuum deposition chamber 30 in a state that the reflecting electrode faces the plasma chamber 31 through the opening 30a and is suspended from the wall section 300 of the vacuum deposition chamber 30. A first turntable 305 in a disk shape is disposed in the vacuum deposition chamber 30 below the reflecting electrode 304 such that the first turntable is rotatably driven by a motor 36 that is arranged in the outside of the vacuum deposition chamber 30 across the bottom wall 303. Plural second turntables 306 in a disk shape with a smaller diameter than the first turntable 305 are disposed such that the second turntables rotate along with the rotation of the first turntable 305 by means of gear mechanisms (not shown).

Each of the second turntables 306 supports three first shafts 10 of which a rod-like support shaft 307 passes through the through hole 10a (see FIG. 1). The support shaft 307 is vertically arranged on a rotating shaft of the second turntable 306. One end of each first shaft 10 is shielded with a jig 41 as a shield member that is attached to cover the yoke 11. An annular spacer 42 is disposed between the first shaft that is located on top and the jig 41 that is attached to the first shaft 10 located in the middle. The details of the jig 41 will be described later.

The assembly 40 that is made by assembling three first shafts 10, three jigs 41 and the spacer 42 rotates, as shown in FIG. 4, about the axial direction of the first shaft along with the rotation of the second turntable 306 and rotates around the reflecting electrode 304 along with the rotation of the first turntable 305.

Three first shafts 10 that construct the assembly 40 are connected with an asymmetrically pulsed power supply 37 by wiring (not shown) via the rotating shaft 360 of the motor 36 and the like. The asymmetrically pulsed power supply 37 applies to each first shaft 10 the pulse voltage of which the absolute value of negative voltage is higher than that of positive voltage at a specified frequency (10 to 250 kHz, for example).

As shown in FIG. 4, the vacuum deposition chamber 30 has, in its inside, a sputter source 38 that is made of metals such as chromium and a heater 39 for heating the assembly 40 to the specified temperature.

(Formation Process of DLC Film) When the DLC film 121 is formed in the spline fitting part 12 of the first shaft 10, the assembly 40 that includes three first shafts 10 is first disposed on the second turntable 306 in the vacuum deposition chamber 30. In an example shown in FIG. 4, twelve assemblies 40 are disposed in the vacuum deposition chamber 30. Then, air in the vacuum deposition chamber 30 is discharged from the exhaust outlet 302a by the vacuum pump. The inside of the vacuum deposition chamber 30 is brought to an approximately vacuum state.

Next, the motor 36 is driven to rotate the first turntable 305 and the second turntable 306. And, the hot cathode 311, the anode 312, and the electron injection electrode 313 are energized to generate plasma 3a in the center of the vacuum deposition chamber 30. The plasma 3a is generated between the opening 30a and the reflecting electrode 304 and maintained in a cylindrical shape such that its middle section is swollen by magnetic force produced by the first coil 33 and the second coil 34. The pulse voltage is applied from the asymmetrically pulsed power supply 37 to each first shaft 10.

Then, Ar gas and hydrogen gas are introduced from the gas nozzle 314 to perform discharge cleaning of the part of the first shaft 10 that is not shielded by the jig 41 (unshielded part).

While the driving of the motor 36 and the application of the pulse voltage are maintained, the sputtering is conducted to adhere the chromium that is discharged from the sputter source 38 to the unshielded part of the first shaft 10. Furthermore, the DLC film 121 is formed on each first shaft 10 by supplying the material gas such as tetramethylsilane (TMS: $Si(CH_3)_4$) gas and hydrocarbon system $C_2H_2$ from the nozzle 35, radially accelerating the material gas in the radial direction of the plasma 3a, colliding and adhering to the unshielded part of each first shaft 10 that is disposed in parallel with the plasma 3a.

Hereinafter, the coating formation method of the present invention will be more specifically described with reference to the Examples 1 and 2. However, the present invention is not limited to the examples.

In the Examples 1 and 2, the hot cathode PIG plasma CVD apparatus 3 illustrated in FIG. 3 is used for the formation of the DLC film 121 on the first shaft 10; however, the shapes of the jig that covers the yoke 11 of the first shaft 10 are different.

Example 1

Figure 5A:
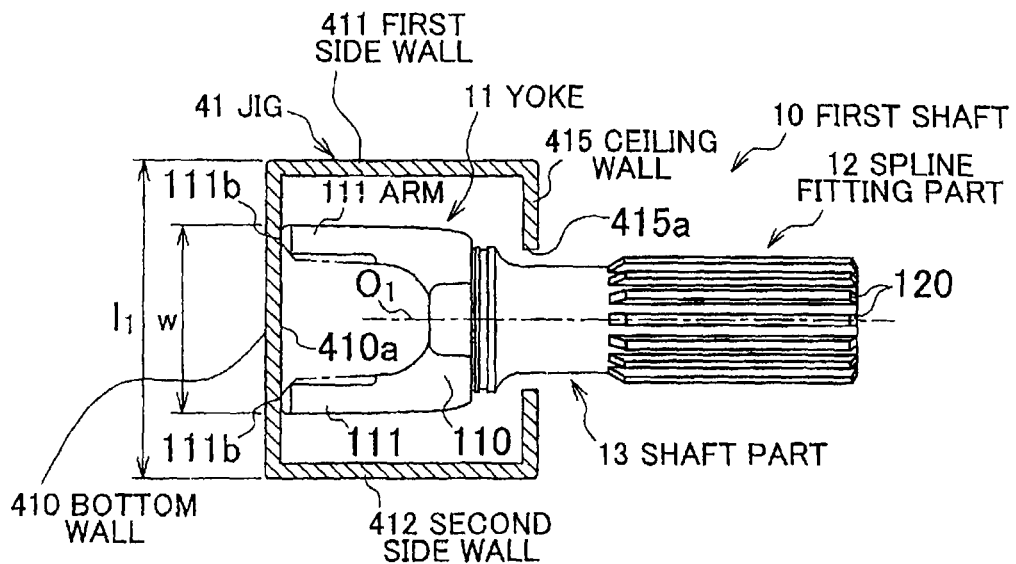
FIG. 5A is a front view of a jig according to an Example 1 of the present invention and the first shaft.
Figure 5B:
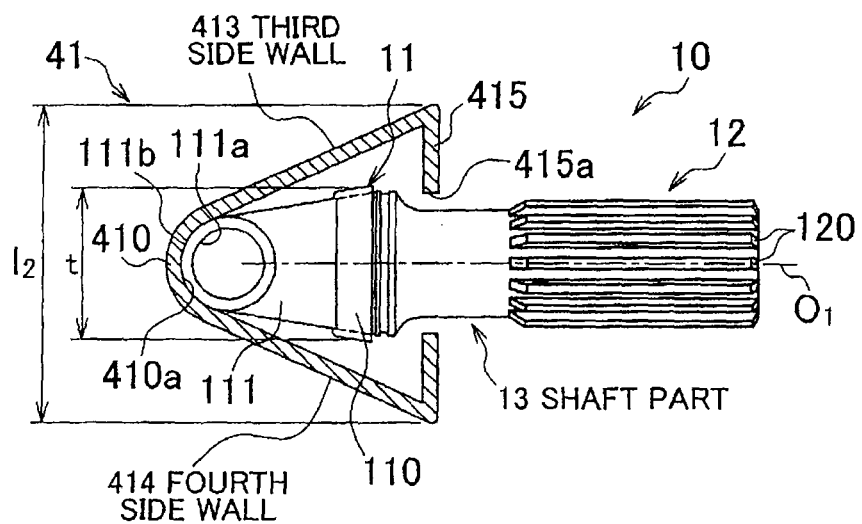
FIG. 5B is a side view of a jig according to the Example 1 of the present invention and the first shaft.

FIG. 5A is a cross-sectional view of the jig 41 according to the Example 1 and a front view of the first shaft 10 of which the jig 41 covers one end that includes the yoke 11, (a view from the direction that the pair of arms 111 are separated). FIG. 5B is a cross-sectional view of the jig 41 according to the Example 1 and a side view of the first shaft 10 of which the jig 41 covers one end that includes the yoke 11 (a view from the direction that the pair of arms 111 are overlapped with each other).

The jig 41 is made of steel such as carbon steel and has a hollow triangle pole shape. The jig 41 has a bottom wall 410 with an arc shape in cross section, a first side wall 411 and a second side wall 412 that have a triangle shape in a plan view and face each other, a third side wall 413 and a fourth side wall 414 that have a rectangle shape in a plan view and are formed between the first side wall 411 and the second side wall 412, and a ceiling wall 415 that faces the bottom wall 410.

The bottom wall 410 is formed such that its cross section has a curvature radius in conformity with the curvature radius of the arc of a semicircle tip 111b of the arm 111. More specifically, the bottom wall 410 has a gutter-like shape of which the inner surface 410a is formed to have the curvature radius identical with or slightly smaller than the curvature radius of the tip 111b of the arm 111 (for example, 0.7 to 1.0 times the curvature radius of the tip 111b). The bottom wall 410 is formed with a through hole (not shown) through which the support shaft 307 (see FIG. 3) is inserted.

The ceiling wall 415 has a rectangle shape in a plan view and is formed with an insertion hole 415a through which the shaft part 13 of the first shaft 10 is inserted in the center part. The angles between the third side wall 413 and the fourth side wall 414, and the ceiling wall 415 are acute.

One end of the first shaft 10 that includes the arm 111 and the base part 110 of the yoke 11 is covered with the jig 41 such that the tip 111b of the arm 111 abuts against the inner surface 410a of the bottom wall 410 of the jig 41. A part of the shaft part 13 and the spline fitting part 12 are out of the range that is covered with the jig 41.

The yoke 11 that is covered with the jig 41 is an uncoated part where the DLC film 121 is not formed. Because the hard DLC film 121 is not formed on the yoke 11, machining to the yoke 11 after the formation process is easy.

The yoke 11 is formed such that the length w in the width direction that is viewed from the direction shown in FIG. 5A (a diameter of the pair of arms 111) is longer than the length t in the thickness direction (perpendicular to the length w) that is viewed from the direction shown in FIG. 5B. Here, the width direction is a cross-sectional direction that includes the pair of arms 111 along the central axis O1 of the retaining holes 111a, and the thickness direction is a direction perpendicular to the width direction and the central axis O1. The length w in the width direction and the length t in the thickness direction of the yoke 11 are formed to be larger than the diameter of the outer periphery of the spline fitting part 12 (that is 49 mm). In a condition that the jig 41 is attached to the first shaft 10, the length $l_1$ of the jig 41 in the width direction of the yoke 11 is the same as the length $l_2$ of the jig 41 in the thickness direction of the yoke 11.

In the part of the first shaft 10 that is not covered with the jig 41, the spline fitting part 12 is a coated part where the DLC film 121 is to be formed. Because the shaft part 13 is not covered with the jig 41, the DLC film 121 may be formed on at least a part of the shaft part. However, the shaft part 13 does not slide with the other member, and therefore, the DLC film 121 on the shaft part 13 is not necessary. Furthermore, the hardness of the DLC film 121 on the shaft part 13 is not required. That is, the shaft part 13 is a middle part that is located between the coated part and the uncoated part.

The jig 41 can be divided into two members in a plane that includes the central axis O1 of the first shaft 10. The jig 41 holds one end of the first shaft 10 in a divided state, and then the jig is attached to the first shaft 10 by connecting the two members. The insertion hole 415a of the ceiling wall 415 may be formed to the size in which the yoke 11 can be inserted, so that the jig can be attached to the first shaft 10 without dividing into two members.

FIG. 6A is a constructive diagram that is viewed from the third side wall 413 of the jig 41 (phase: 90°) and that shows a state in which three first shafts 10, three jigs 41, and a spacer 42 are assembled to construct the assembly 40 that is set in the vacuum deposition chamber 30 of the hot cathode PIG plasma CVD apparatus 3. FIG. 6B is a constructive diagram that is viewed from the first side wall 411 of the jig 41 (phase: 0°) and that shows a state in which three first shafts 10, three jigs 41, and a spacer 42 are assembled to construct the assembly 40 that is set in the vacuum deposition chamber 30 of the hot cathode PIG plasma CVD apparatus 3.

Although each of three first shafts 10 has the same size and shape, in order to distinguish one from the other, the following description will be made such that when the shafts are set in the vacuum deposition chamber 30, the first shaft 10 located in the uppermost part (on the side of the plasma chamber 31) is referred to as an "upper first shaft (reference numeral 10A)", the first shaft 10 located in the lowermost part is referred to as a "lower first shaft (reference numeral 10C)", and the first shaft 10 located between the upper first shaft 10A and the lower first shaft 10C is referred to as a "middle first shaft (reference numeral 10B)".

The upper first shaft 10A, the middle first shaft 10B, and the lower first shaft 10C are arranged in a line along the axial direction so that each central axis corresponds to the other. The upper first shaft 10A and the middle first shaft 10B are arranged such that the end on the side of the yoke 11 is directed upward, and the lower first shaft 10C is arranged such that the end on the side of the yoke 11 is directed downward. Each yoke 11 of the upper first shaft 10A, the middle first shaft 10B, and the lower first shaft 10C is covered with the jig 41 and shielded from the plasma 3a that is generated in the vacuum deposition chamber 30.

The spacer 42 is arranged between an end face 12a on the side of the spline fitting part 12 of the upper first shaft 10A and the jig 41 attached to the middle first shaft 10B. The middle first shaft 10B and the lower first shaft 10C are arranged such that the respective end faces 12a on the sides of the spline fitting part 12 face each other.

Assume that the axial direction of the upper first shaft 10A, the middle first shaft 10B, and the lower first shaft 10C is an X-direction, and that the direction perpendicular to the X-direction and toward the plasma 3a when the shaft is set in the vacuum deposition chamber 30 of the hot cathode PIG plasma CVD apparatus 3 is a Y-direction. As shown in FIG. 6A, the dimension $a_1$ in the X-direction between the lower end of the jig 41 attached to the upper first shaft 10A and the upper end of the spline fitting part 12 of the upper first shaft 10A is 35 mm, the dimension $b_1$ in the X-direction between the lower end of the jig 41 attached to the upper first shaft 10A and the upper end of the jig 41 attached to the middle first shaft 10B is 143 mm, and the dimension $c_1$ in the X-direction between the lower end of the spline fitting part 12 of the upper first shaft 10A and the upper end of the jig 41 attached to the middle first shaft 10B is 9 mm. The dimension $c_1$ corresponds to the thickness of the spacer 42.

Furthermore, the dimension $d_1$ in the X-direction between the lower end of the jig 41 attached to the middle first shaft 10B and the upper end of the spline fitting part 12 of the middle first shaft 10B is 35 mm, and the dimension $e_1$ in the X-direction between the lower end of the jig 41 attached to the middle first shaft 10B and the upper end of the jig 41 attached to the lower first shaft 10C is 272 mm.

The dimension $f_1$ in the Y-direction between the outer periphery of the spline fitting part 12 (tip of the outer peripheral spline teeth 120) of the upper first shaft 10A, the middle first shaft 10B, and the lower first shaft 10C and the end in the Y-direction of each jig 41 in 90° phase is 23 mm.

As shown in FIG. 6B, the dimension $g_1$ in the Y-direction between the outer periphery of the spline fitting part 12 of the upper first shaft 10A and the tip 41a of the jig 41 attached to the middle first shaft 10B in 0° phase is 25 mm. However, the outer periphery of the spline fitting part 12 of, the upper first shaft 10A projects to +Y-direction as compared with the tip 41a of the jig 41 attached to the middle first shaft 10B in 0° phase, and therefore the projection amount of the outer periphery of the spline fitting part 12 of the upper first shaft 10A to the +Y-direction is 0 mm.

The dimension h1 in the Y-direction between the outer periphery of the spline fitting part 12 of the middle first shaft 10B and the end in the Y-direction of the jig 41 attached to the middle first shaft 10B in 0° phase is 23 mm. The dimension in the Y-direction between the outer periphery of the spline fitting part 12 of the upper first shaft 10A and the end in the Y-direction of the jig 41 attached to the upper first shaft 10A in 0° phase, and the dimension in the Y-direction between the outer periphery of the spline fitting part 12 of the lower first shaft 10C and the end in the Y-direction of the jig 41 attached to the lower first shaft 10C in 0° phase are 23 mm that is the same as the dimension $h_1$.

The dimensions $a_1$, $c_1$, and $d_1$ are examples of separation spacing that is set to prevent the decrease of the hardness of the DLC film 121 on the spline fitting part 12 based on the findings that the hardness of the DLC film 121 decreases in the vicinity of the jig 41. In this Example, the separation spacing is set to be 9 mm or larger.

Example 2

Figure 7A:
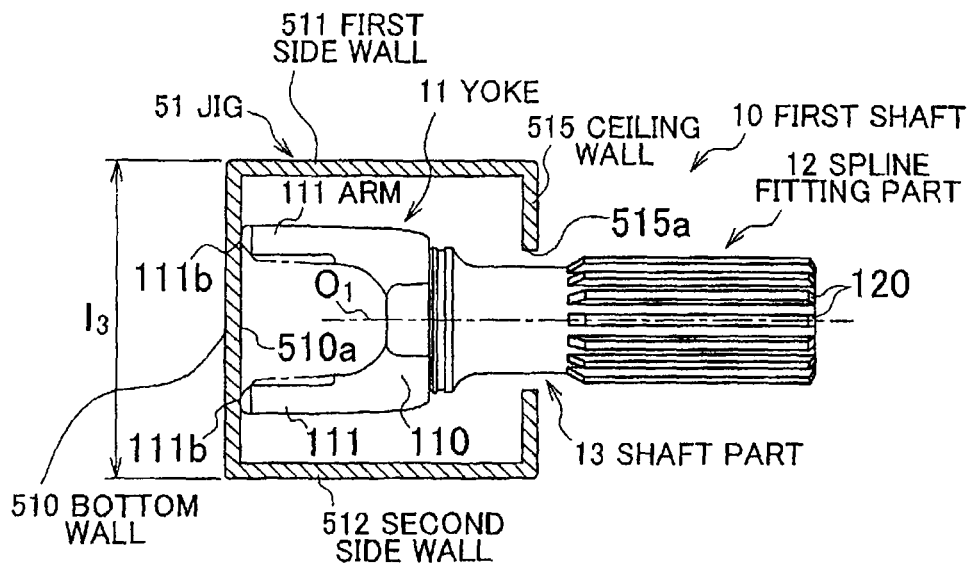
FIG. 7A is a front view of a jig according to an Example 1 of the present invention and the first shaft.
Figure 7B:
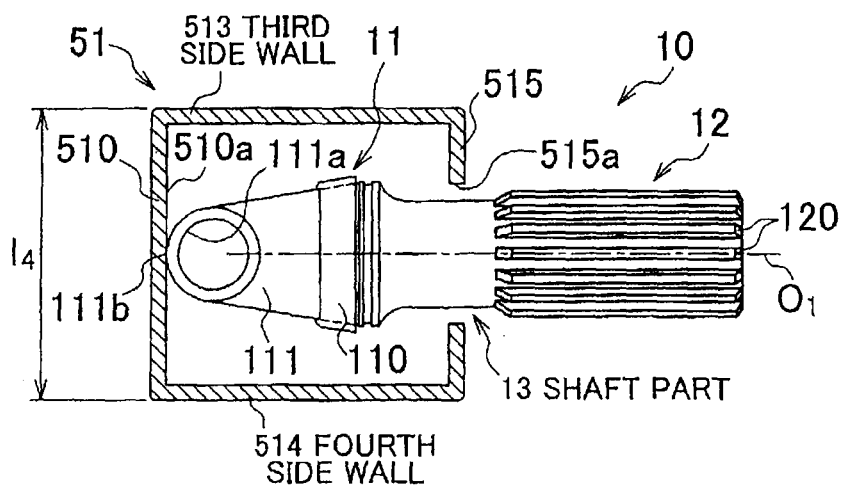
FIG. 7B is a side view of a jig according to the Example 1 of the present invention and the first shaft.

FIG. 7A is a cross-sectional view of the jig 51 according to the Example 2 and a front view of the first shaft 10 of which the jig 51 covers one end that includes the yoke 11 (a view from the direction that the pair of arms 111 are separated). FIG. 7B is a cross-sectional view of the jig 51 according to the Example 2 and a side view of the first shaft 10 of which the jig 51 covers one end that includes the yoke 11 (a view from the direction that the pair of arms 111 are overlapped with each other).

The jig 51 is made of steel such as carbon steel and has a hollow rectangular parallelepiped shape. The jig 51 has a bottom wall 510, a ceiling wall 515 that faces the bottom wall 510, and a first side wall 511, a second side wall 512, a third side wall 513, and a fourth side wall 514 that are formed between the bottom wall 510 and the ceiling wall 515. The ceiling wall 515 is formed with an insertion hole 515a through which the shaft part 13 of the first shaft 10 is inserted in the center part.

The first side wall 511 and the third side wall 513, and the second side wall 512 and the fourth side wall 514 face each other across the yoke 11 of the first shaft 10, respectively. Each of the bottom wall 510, the first side wall 511, the second side wall 512, the third side wall 513, and the fourth side wall 514, and the ceiling wall 515 has a rectangle shape in a plan view.

One end of the first shaft 10 that includes the arms 111, 111 and the base part 110 of the yoke 11 is covered with the jig 51 such that the tip 111b of the arm 111 abuts against the inner surface 510a of the bottom wall 510 of the jig 51.

In a condition that the jig 51 is attached to the first shaft 10, the length $l_3$ of the jig 51 in the width direction of the yoke 11 is formed longer than the length $l_4$ of the jig 51 in the thickness direction of the yoke 11.

The jig 51 can be divided into two members in a plane that includes the central axis O1 of the first shaft 10 as is the case with the jig 41 according to the Example 1. The jig 51 holds one end of the first shaft 10 in a divided state, and then the jig is attached to the first shaft 10 by connecting the two members. The insertion hole 515a of the ceiling wall 515 may be formed to the size in which the yoke 11 can be inserted, so that the jig can be attached to the first shaft 10 without dividing into two members.

FIG. 8A is a constructive diagram that is viewed from the third side wall 513 of the jig 51 (phase: 90°) and that shows a state in which three first shafts 10, three jigs 51, and a spacer 42 are assembled to construct the assembly 50 that is set in the vacuum deposition chamber 30 of the hot cathode PIG plasma CVD apparatus 3. FIG. 8B is a constructive diagram that is viewed from the first side wall 511 of the jig 51 (phase: 0°) and that shows a state in which three first shafts 10, three jigs 51, and a spacer 42 are assembled to construct the assembly 50 that is set in the vacuum deposition chamber 30 of the hot cathode PIG plasma CVD apparatus 3. The structure of the assembly 50 is the same as the assembly 40 according to the Example 1 shown in FIG. 6, except that the shape of the jig differs.

When the X-direction and the Y-direction are defined as is the case with the Example 1, as shown in FIG. 8A, the dimension $a_2$ in the X-direction between the lower end of the jig 51 attached to the upper first shaft 10A and the upper end of the spline fitting part 12 of the upper first shaft 10A is 17 mm, the dimension $b_2$ in the X-direction between the lower end of the jig 51 attached to the upper first shaft 10A and the upper end of the jig 51 attached to the middle first shaft 10B is 120 mm, and the dimension $c_2$ in the X-direction between the lower end of the spline fitting part 12 of the upper first shaft 10A and the upper end of the jig 51 attached to the middle first shaft 10B is 9 mm.

Furthermore, the dimension $d_2$ in the X-direction between the lower end of the jig 51 attached to the middle first shaft 10B and the upper end of the spline fitting part 12 of the middle first shaft 10B is 17 mm, and the dimension $e_2$ in the X-direction between the lower end of the jig 51 attached to the middle first shaft 10B and the upper end of the jig 51 attached to the lower first shaft 10C is 240 mm.

The dimension $f_2$ in the Y-direction between the outer periphery of the spline fitting part 12 (tip of the outer peripheral spline teeth 120) of the upper first shaft 10A, the middle first shaft 10B, and the lower first shaft 10C and the end in the Y-direction of each jig 51 in 90° phase is 23 mm.

As shown in FIG. 8B, the dimension $g_2$ in the Y-direction between the outer periphery of the spline fitting part 12 of the middle first shaft 10B and the end in the Y-direction of the jig 51 attached to the middle first shaft 10B in 0° phase is 16 mm. The dimension in the Y-direction between the outer periphery of the spline fitting part 12 of the upper first shaft 10A and the end in the Y-direction of the jig 51 attached to the upper first shaft 10A in 0° phase, and the dimension in the Y-direction between the outer periphery of the spline fitting part 12 of the lower first shaft 10C and the end in the Y-direction of the jig 51 attached to the lower first shaft 10C in 0° phase are 16 mm that is the same as the dimension $g_2$.

The dimensions $a_2$, $c_2$, and $d_2$ are examples of separation spacing that is set to prevent the decrease of the hardness of the DLC film 121 on the spline fitting part 12 based on the findings that the hardness of the DLC film 121 decreases in the vicinity of the jig 51. In this Example, the separation spacing is set to be 9 mm or larger.

Figure 9B:
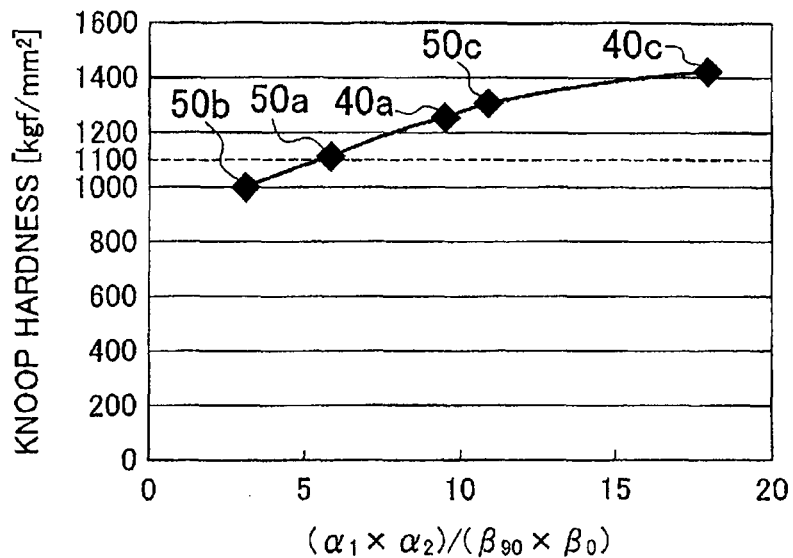
FIG. 9B is a graph showing the relationship between calculation values of $(\alpha_1 \times \alpha_2/(\beta_{90} \times \beta_0))$ and the surface hardness of measurement sites.
Figure 9C:
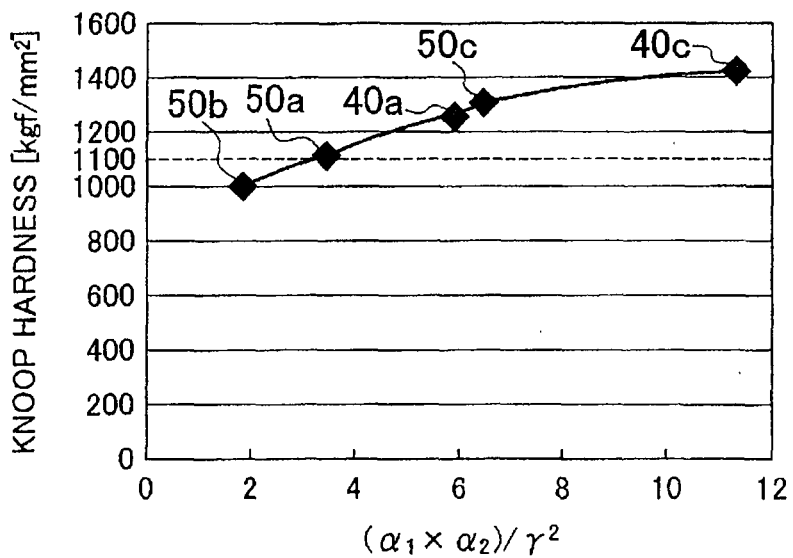
FIG. 9C is a graph showing the relationship between calculation values of $(\alpha_1 \times \alpha_2)/\gamma^2$ and the surface hardness of measurement sites.

FIGS. 9A, 9B, and 9C are a table and graphs showing experimental results of the surface hardness in the case that the assemblies 40 and 50 according to the above Examples 1 and 2 are disposed in the vacuum deposition chamber 30 of the hot cathode PIG plasma CVD apparatus 3 to form the DLC film.

FIG. 9A is a table showing dimensional relationships among the jigs 41 and 51 and three points of the spline fitting part 12 of the first shaft 10 in the assemblies 40 and 50 according to the Examples 1 and 2 and showing the measurement results of the surface hardness. Here, the surface hardness is represented in Knoop hardness.

The Knoop hardness is measured with a test machine adapted or conforming to JIS B7734 (microhardness tester). That is, the Knoop hardness Hk (kgf/mm$^2$) is quotient of which the load when the measurement surface is recessed in a square pyramid by using a Knoop indenter (a diamond square pyramid indenter that has diagonal line angles of 172°30' and 130°) is divided by the projection area of the recess that is derived from the length of a longer diagonal line of a permanent recess and expressed in the following equation (1):

$$Hk=14.23*F/L2 \quad (1),$$

where, F denotes the load (N), and L denotes the length of the longer diagonal line (mm).

As shown in FIG. 6A, the surface hardness of the assembly 40 according to the Example 1 was measured at three measurement sites that include a first site 40a, a second site 40b, and a third site 40c. The first site 40a is an upper end of the spline fitting part 12 of the upper first shaft 10A. The second site 40b is a lower end of the spline fitting part 12 of the upper first shaft 10A. The third site 40c is an upper end of the spline fitting part 12 of the middle first shaft 10B. For each of the measurement sites, the measurements were conducted at plural points along the circumferential direction, and a mean value of the measurement results at the plural points was considered as the measurement value of the surface hardness.

As shown in FIG. 8B, the surface hardness of the assembly 50 according to the Example 2 was measured at three measurement sites that include a fourth site 50a, a fifth site 50b, and a sixth site 50c. The measurement sites of the fourth site 50a, the fifth site 50b, and the sixth site 50c correspond to the first site 40a, the second site 40b, and the third site 40c, respectively. At the measurement sites, the jig 41 or 51 that is arranged at the closest distance of the measurement site in the X-direction projects to Y-direction as compared with the measurement site, except for the second site 40b in 0° phase.

In the table shown in FIG. 9A, a first column 9a shows the dimension of $\alpha_1$. The symbol α1 is the dimension from each measurement site to the jig 41 or 51 that is arranged at the closest distance of the measurement site in the X-direction. The first column 9a shows dimensional values of $\alpha_1$ with the symbols of the dimension measurement points ($a_1$, $c_1$, $d_1$, etc.) in FIGS. 6A and 8A.

A second column 9b shows dimensions of $\alpha_2$. The symbol $\alpha_2$ is the dimension between two jigs 41 or jigs 51 in the X-direction where each measurement site is included. The dimensional values of $\alpha_2$ are also shown with the symbols of the dimension measurement points ($b_1$, $e_1$, $d_2$, etc.) in FIGS. 6A and 8A.

A third column 9c shows dimensions of $\beta_{90}$. The symbol $\beta_{90}$ is the dimension between each measurement site and the end of the jig 41 or 51 in the Y-direction in 90° phase. That is, $\beta_{90}$ is the distance from the outer periphery of the spline fitting part 12 to the surface of the jig 41 or 51 on the side of the plasma 3a in the width direction of the yoke 11. The third column 9c shows dimensional values of $\beta_{90}$ with the symbols of the dimension measurement points ($f_1$ and $f_2$) in FIGS. 6A and 8A.

A fourth column 9d shows dimensions of $\beta_0$. The symbol β0 dimension between each measurement site and the end of the jig 41 or 51 in the Y-direction in 0° phase. That is, $\beta_0$ is the distance from the outer periphery of the spline fitting part 12 to the surface of the jig 41 or 51 on the side of the plasma 3a in the width direction of the yoke 11. The fourth column 9d shows dimensional values of $\beta_0$ with the symbols of the dimension measurement points ($h_1$ and $h_2$) in FIGS. 6A and 8A.

Here, the dimension of $\beta_0$ of the second site 40b corresponds to the dimension $g_1$ shown in FIG. 6B; however, the projection amount of the jig 41 in the Y-direction at the measurement site is 0 mm as described above, and therefore the dimensional value of $\beta_0$ is set to be zero.

The fifth column 9e shows calculation values of $((\alpha_1 \times \alpha_2)/(\beta_{90} \times \beta_0))$. For the second site 40b, the dimensional value of $\beta_0$ is set to zero, and therefore the calculation value is not shown.

A sixth column 9f shows dimensions of $\gamma$. The symbol γ is a mean value of the distance (average distance) from the outer periphery of the spline fitting part 12 of the first shaft 10 to the end of the jig 41 or 51 in the direction perpendicular to the X-direction. γ can be obtained as a value that is a result of the subtraction of the radius of the outer periphery of the spline fitting part 12 from the radius of the circle that has the same area as the area of the ceiling wall 415 of the jig 41 (assuming that the insertion hole 415a is not formed). Similarly, in the Example 2, γ can be calculated based on the area of the bottom wall 510 or the ceiling wall 515 of the jig 51.

The seventh column 9g shows calculation values of $((\alpha_1 \times \alpha_2)/\gamma^2)$. For the second site 40b, as is the case with the fifth column 9e, the calculation value is not shown.

The eighth column 9h shows measurement results of Knoop hardness in respective measurement sites. In the experimental results, a difference in surface hardness due to positions in the circumferential direction of the spline fitting part 12 of the first shaft 10 was hardly found.

FIG. 9B is a graph showing the relationship between calculation values of $(\alpha_1 \times \alpha_2/(\beta_{90} \times \beta_0))$ and the surface hardness (Knoop hardness) of measurement sites (except for the second site 40b). As is apparent from FIG. 9B, the calculation values of $(\alpha_1 \times \alpha_2/(\beta_{90} \times \beta_0))$ and the surface hardness have a correlation and also have a relationship such that the surface hardness increases as the calculation value becomes larger. When the dimensional relation between the first shaft 10 and the jig 41 or 51 is defined so as to satisfy the expression as expressed in the following equation (2), it is found that the Knoop hardness of 1,100 (kgf/mm²) necessary for securing the durability of the propeller shaft 100 can be obtained.

$$\alpha 1 \times \alpha 2/(\beta 90 \times \beta 0) \geq 5.9 \quad (2)$$

FIG. 9C is a graph showing the relationship between calculation values of $((\alpha_1 \times \alpha_2)/\gamma^2)$ and the surface hardness (Knoop hardness) of measurement sites (except for the second site 40b). As is apparent from FIG. 9C, the calculation values of $((\alpha_1 \times \alpha_2)/\gamma^2)$ and the surface hardness have a correlation and also have a relationship in which the surface hardness increases as the calculation value becomes larger. When the dimensional relation between the first shaft 10 and the jig 41 or 51 is defined so as to satisfy the expression as expressed in the following equation (3), it is found that the Knoop hardness of 1,100 (kgf/mm²) necessary for securing the durability of the propeller shaft 100 can be obtained.

$$(\alpha 1 \times \alpha 2)/\gamma^2 \geq 3.48 \quad (3)$$

According to the embodiments as described above, the following effects can be obtained.

(A) By shielding the part where the DLC film 121 is not formed (yoke 11) with the jig 41 or 51, the DLC film 121 can be formed to the parts except for the aforementioned part. Accordingly, the number of processes can be reduced in comparison to the case that the DLC film 121 on the yoke is removed after the formation of the DLC film 121 over the entire first shaft 10.

(B) Because the jig 41 or 51 is attached with a specified separation spacing (9 mm or longer) from the spline fitting part 12 of the first shaft 10 in the X-direction, the Knoop hardness of the DLC film 121 in the spline fitting part 12 can be 990 (kgf/mm²) or higher.

(C) For the first site 40a, the third site 40c, the fourth site 50a, and the sixth site 50c, the jig 41 or 51 is attached so as to satisfy the above equations (1) and (2). Accordingly, the Knoop hardness of the DLC film 121 in the spline fitting part 12 can 1,110 (kgf/mm²) or higher.

(D) The assembly 40 or 50 in which the plural (three in the above embodiments) first shafts 10 are arranged along the axial direction is disposed in the vacuum deposition chamber 30 to form the DLC film 121. Accordingly, the processing efficiency can be improved.

(E) Two of three first shafts 10 that construct the assembly 40 or 50 (the middle first shaft 10B and the lower first shaft 10C) are arranged such that the respective end faces 12a on the sides of the spline fitting part 12 abut against each other. Accordingly, the spacing between the jigs 41 and between the jigs 51 that are attached to the respective first shafts 10 can be expanded, and the hardness of the DLC film 121 on the spline fitting part 12 of the two first shafts 10 can be improved.

(F) Because the bottom wall 410 of the jig 41 is formed in an arc shape, as shown in FIG. 6B, the outer periphery of the spline fitting part 12 of the upper first shaft 10A in 0° phase projects to the Y-direction as compared to the bottom wall section of the jig 41 that is attached to the middle first shaft 10B, and the hardness of the DLC film 121 on the spline fitting part 12 can be improved.

(G) Because the jig 41 or 51 can be easily removed from and attached to the yoke 11 of the first shaft 10, the work efficiency can be improved in comparison to the case that the yoke 11 is shielded by being covered with aluminum foil.

While the invention has been described with reference to example embodiments thereof, it is to be understood that the invention is not limited to the described embodiments or constructions. To the contrary, the invention is intended to cover various modifications and equivalent arrangements. In addition, while the various elements of the example embodiments are shown in various combinations and configurations, other combinations and configurations, including more, less or only a single element, are also within the scope of the invention.

(i) In the above embodiment, the jig 41 was formed in a triangle pole shape, and the jig 51 was formed in a rectangular parallelepiped shape. However, the present invention is not limited to the above, but various shapes such as a cylindrical shape may be used.

(ii) In the above embodiment, one assembly 40 or 50 was constructed to include three first shafts 10. However, the present invention is not limited to the above, but two first shafts 10 are assembled to construct one assembly. Or, four or more first shafts 10 may be assembled to construct one assembly. Arrangement methods of the first shafts 10 in one assembly are not limited to those shown in FIGS. 6A and 8B.

(iii) In the above embodiment, the jig 41 or 51 was made of carbon steels. However, the present invention is not limited to the above, but the jig may be made of stainless steels, aluminum, or resins.

(iv) In the above embodiment, the hot cathode PIG plasma CVD apparatus 3 was constructed such that the plasma 3a was generated in the vertical direction. However, the present invention is not limited to the above, but the apparatus may be constructed such that the plasma 3a is generated in a horizontal direction or in an inclined direction with respect to the vertical direction. In this case, the first shaft 10 may be arranged to be parallel to the plasma 3a.

(v) The above embodiment was described about the case in which the DLC film 121 as an example of the coating had the two-layer structure that includes an intermediate layer that contains materials such as chromium and the DLC-Si layer. However, the intermediate layer may not be required. The DLC film 121 may be the film that is made of the DLC that does not contain Si. Furthermore, the coating is not limited to the DLC, but may be titanium nitride (TiN) and the like. In this case, the coating can be formed by supplying the material gas that corresponds to the composition of the coating into the vacuum deposition chamber.

(vi) In the above embodiment, the propeller shaft 100 was constructed such that the first shaft 10 was coupled to the input shaft of the differential gear of the vehicle and such that the second shaft 20 was coupled to the output shaft of the transmission of the vehicle. On the contrary, the propeller shaft may be constructed such that the first shaft 10 is coupled to the output shaft of the transmission of the vehicle and such that the second shaft 20 is coupled to the input shaft of the differential gear of the vehicle. Here, the input shaft of the differential gear and the output shaft of the transmission are examples of the drive shaft that transmits the driving force of the drive source of the vehicle.

(vii) The above embodiment was described about the case in which the first shaft 10 as the component member of the propeller shaft 100 was used as an example of the coated body. However, the coated body is not limited to the above. As the coated body, any member may be used as long as the hardness of the coating is required and an uncoated part is also required partially.

What is claimed is:

1. A formation method of a coating that coats a coated portion of a body with the coating comprising:
   generating cylindrical plasma in a vacuum deposition chamber and supplying material gas into the vacuum deposition chamber;
   applying pulse voltage to the body; and
   attaching a shield member to the body, the shield member shielding an uncoated portion of the body where the coating is not formed so as to present a separation spacing between the shield member and the coated portion of the body where the coating is to be formed in order to prevent decrease of hardness of the coating in the coated portion of the body,
   wherein the body is arranged in the vacuum deposition chamber such that the coating portion of the body is parallel to the plasma, and
   wherein the body is arranged in a direction perpendicular to an axis of the cylindrical plasma.

2. The formation method of a coating according to claim 1, wherein:
   the body is rotated about its axis, so that the coating is formed on the coated portion of the body.

3. The formation method of a coating according to claim 1, wherein:
   the body is a shaft member that has the uncoated portion at a first axial end;
   two bodies are arranged in the vacuum deposition chamber such that respective second axial ends of the bodies face each other and shield members are attached to the first axial end of each of the bodies; and
   the coating is formed on the coated portion.

4. The formation method of a coating according to claim 1, wherein:
   the body is a shaft component member that constructs a propeller shaft for a vehicle that is capable of extending and contracting in an axial direction;
   the coated portion is a spline fitting part that slides with other component member of the propeller shaft in the axial direction by extension and contraction of the propeller shaft; and
   the uncoated portion is a coupling part that couples the propeller shaft to another drive shaft.

5. The formation method of a coating according to claim 4, wherein:
   a tip of the coupling part in the axial direction of the body has a U-shape that includes an arc recess; and
   a part of the shield member that corresponds to the tip of the coupling part is formed in an arc shape in conformity with an arc of the tip.

6. The formation method of a coating according to claim 4, wherein a dimensional relation between the body and the shield member as seen from the plasma satisfies a following expression:

$$\alpha_1 \times \alpha_2 / \gamma^2 \geq 3.48,$$

where $\alpha_1$ is the separation spacing, $\alpha_2$ is a distance in the axial direction between two shield members that are attached such that the body is interposed between the two shield members, and $\gamma$ is an average distance from a surface of the coated portion to a surface of the shield member on a side of the plasma.

7. The formation method of a coating according to claim 5, wherein
   the coupling part is formed such that a width between ends of the U-shaped tip is greater than a thickness of the tip; and a dimensional relation between the body and the shield member as seen from the plasma satisfies a following expression:

$$\alpha_1 \times \alpha_2 / (\beta_1 \times \beta_2) \geq 5.9,$$

where $\alpha_1$ is the separation spacing, $\alpha_2$ is a distance in the axial direction between two shield members that are attached such that the body is interposed between the two shield members, $\beta_1$ is a distance from a surface of the coated portion to a surface of the shield member on a side of the plasma in the width of the coupling part, and $\beta_2$ is a distance from a surface of the coated portion to a surface of the shield member on a side of the plasma in the thickness of the coupling part.

8. The formation method of a coating according to claim 1, wherein the separation spacing is greater than or equal to 9 mm.

9. The formation method of a coating according to claim 1, wherein the shield member includes a bottom wall, a ceiling wall that faces the bottom wall, and first, second, third, and fourth side walls connecting the bottom wall and the ceiling wall.

10. The formation method of a coating according to claim 9, wherein the bottom wall has an arc shape in cross section, the first and second side walls have a triangle shape in plan view and face each other, the third and fourth side walls have a rectangle shape in plan view and face each other, and the ceiling wall has a rectangle shape in plan view and includes an insertion hole.

11. The formation method of a coating according to claim 9, wherein each of the bottom wall, the first side wall, the second side wall, the third side wall, the fourth side wall, and the ceiling wall have a rectangle shape in plan view.

* * * * *